United States Patent
Fan et al.

(10) Patent No.: US 10,394,142 B2
(45) Date of Patent: Aug. 27, 2019

(54) SCAN REFLECTIVE MIRROR MONITORING SYSTEM AND METHOD, FOCUSING AND LEVELING SYSTEM

(71) Applicant: SHANGHAI MICRO ELECTRONICS EQUIPMENT (GROUP) CO., LTD., Shanghai (CN)

(72) Inventors: Jiming Fan, Shanghai (CN); Haijiang Wang, Shanghai (CN)

(73) Assignee: SHANGHAI MICRO ELECTRONICS EQUIPMENT (GROUP) CO., LTD., Shanghai (CN)

(*) Notice: Subject to any disclaimer, the term of this patent is extended or adjusted under 35 U.S.C. 154(b) by 0 days.

(21) Appl. No.: 16/072,212

(22) PCT Filed: Jan. 23, 2017

(86) PCT No.: PCT/CN2017/072214
§ 371 (c)(1),
(2) Date: Jul. 24, 2018

(87) PCT Pub. No.: WO2017/129095
PCT Pub. Date: Aug. 3, 2017

(65) Prior Publication Data
US 2019/0025718 A1    Jan. 24, 2019

(30) Foreign Application Priority Data
Jan. 26, 2016    (CN) .......................... 2016 1 0052984

(51) Int. Cl.
*G03F 9/00*    (2006.01)
*G02B 26/08*   (2006.01)
(Continued)

(52) U.S. Cl.
CPC ....... *G03F 9/7034* (2013.01); *G02B 26/0816* (2013.01); *G02B 26/101* (2013.01);
(Continued)

(58) Field of Classification Search
CPC ..... G03F 9/7023; G03F 9/7026; G03F 9/7034
See application file for complete search history.

(56) References Cited

U.S. PATENT DOCUMENTS 4,558,949 A     12/1985  Uehara et al.
4,607,356 A *   8/1986   Bricot .................... G02B 26/08
                                                 359/225.1
(Continued)

FOREIGN PATENT DOCUMENTS

| CN | 103389623 A | 11/2013 |
| CN | 104133345 A | 11/2014 |
| CN | 104423181 A | 3/2015  |

*Primary Examiner* — Steven Whitesell Gordon
(74) *Attorney, Agent, or Firm* — Muncy, Geissler, Olds & Lowe, P.C.

(57) ABSTRACT

A scanning mirror monitoring system and method as well as a focusing and leveling system are disclosed. The scanning mirror monitoring system includes a simple harmonic motion detector unit and a signal processing unit (25). The simple harmonic motion detector unit monitors a simple harmonic motion of a scanning mirror (8) and produces a simple harmonic signal. The signal processing unit (25) receives the simple harmonic signal and instructs a scanning mirror actuator unit (27) to adjust the amplitude and/or position of the scanning mirror (8) based on a variation found in the simple harmonic signal. The signal processing unit (25) identifies the variation by monitoring an optical intensity profile.

16 Claims, 6 Drawing Sheets

(51) Int. Cl.
  *G02B 26/10* (2006.01)
  *G02B 27/18* (2006.01)
  *G02B 27/16* (2006.01)
  *G03F 7/20* (2006.01)

(52) U.S. Cl.
  CPC .......... *G02B 26/106* (2013.01); *G02B 27/16* (2013.01); *G02B 27/18* (2013.01); *G03F 9/7026* (2013.01); *G03F 7/70641* (2013.01); *G03F 2007/2067* (2013.01)

(56) References Cited

U.S. PATENT DOCUMENTS

2009/0141290 A1* 6/2009 Michelin ............... G03F 9/7026
  356/623
2012/0212749 A1* 8/2012 Den Boef .......... G02B 21/0048
  356/615

* cited by examiner

SCAN REFLECTIVE MIRROR MONITORING SYSTEM AND METHOD, FOCUSING AND LEVELING SYSTEM

TECHNICAL FIELD

The present invention relates to a scanning mirror monitoring system and method as well as to a focusing and leveling system, for use in the field of photolithography machines.

BACKGROUND

A projection photolithography machine is a device for projecting a pattern on a photomask onto the surface of a wafer by using a projection objective. The performance of an exposure process carried out by a photolithography machine will be seriously impaired if some areas of the wafer surface in an exposure field are not within an effective depth of focus (DoF) due to a deviation or tilt of the wafer from a focal plane of the objective. For this reason, a focusing and leveling system is adopted to precisely control the position of the wafer within the exposure field. Existing focusing and leveling systems can achieve this by acquiring values of height and tilt of the wafer surface within the exposure field, determining whether correct focusing and leveling has been attained based on the values and making appropriate adjustments if necessary, so as to precisely control the position of the wafer based on the determination.

As shown in FIG. 1, in a conventional scanning mirror-based focusing and leveling system, a measuring beam emanated from an illumination unit 101 passes through a projection slit 102 and is reflected by a first planar mirror 103 onto the surface of a wafer 104, forming thereon a light spot. The reflected beam from the surface of the wafer 104 is further reflected by a second planar mirror 105 and is then incident on a scanning mirror 106 which periodically vibrates in a simple harmonic motion and thus modulates the optical signal to improve its signal-to-noise ratio (SNR). After leaving the scanning mirror 106, the beam propagates through a detection slit 107 and strikes a photodetector 108 which then outputs a voltage signal produced based on the received optical intensity. As a result of the modulation effectuated by the scanning mirror 106, the voltage signal output from the photodetector 108 is a periodic dynamic voltage signal. Finally, this dynamic voltage signal is analyzed to detect an amount of defocus of the surface of the wafer 104. The scanning mirror 106 serves as a reference for the focusing and leveling system and is a very critical motion component thereof because its stability in terms of scanning amplitude and position directly determines the system's overall performance. Under the effects of the stability of control and actuation signals, material fatigue of a pivoting axle of the mirror 106 over time, and changes in the ambient temperature and pressure, the vibration amplitude and position of the scanning mirror 106 may vary and hence adversely affect the performance of the focusing and leveling system.

Currently, a common solution for the problem arising from variations in the vibration amplitude and position of the scanning mirror is to irregularly assess and calibrate the focusing and leveling system. In other words, measurement errors and other adverse outcomes arising from variations in the vibration amplitude and position of the scanning mirror are eliminated by means of calibrating the focusing and leveling system from time to time. However, shifts of the object under test and status changes of the scanning mirror are generally coupled together, so that this method is disadvantageous in being incapable of accurately distinguishing whether there is a status change in the scanning mirror. Another conventional solution allows calibration and adjustment of only the vibration amplitude of the scanning mirror. It, however, requires a wafer stage system of the photolithography machine to be involved and requires the machine itself to stop performing the ongoing task. There is still another conventional solution in which a separate monitoring device is employed to monitor and calibrate the vibration amplitude of the scanning mirror. This approach, however, can only monitor the vibration amplitude of the scanning mirror without doing anything to positional shifts of the scanning mirror itself, which may also deteriorate the measurement accuracy of the focusing and leveling system. Therefore, there has not been proposed, in the prior art, a solution capable of measuring and controlling, in real time, variations both in the vibration amplitude and position of the scanning mirror.

SUMMARY OF THE INVENTION

It is an object of the present invention to provide a scanning mirror monitoring system and method, which can measure and regulate, in real time, variations both in the amplitude and position of a scanning mirror, and further provide a focusing and leveling system.

To this end, the subject matter of the present invention lies in:

a scanning mirror monitoring system, comprising a simple harmonic motion detector unit and a signal processing unit, the simple harmonic motion detector unit configured to monitor a simple harmonic motion of the scanning mirror and to produce a simple harmonic signal, the signal processing unit configured to receive the simple harmonic signal and, based on a variation of the simple harmonic signal, control a scanning mirror actuator unit to adjust an vibration amplitude and/or a position of the scanning mirror.

Preferably, the simple harmonic signal is a simple harmonic optical intensity signal.

Preferably, the simple harmonic motion detector unit comprises a first illumination unit, a first projection unit and a first detection unit, wherein a first measuring beam emanated from the first illumination unit passes through the first projection unit, thereby forming a first detection light spot, which is further incident on the scanning mirror to produce a first reflected beam, wherein the first reflected beam is incident on the first detection unit, which then produces the simple harmonic signal, wherein the first detection unit is connected to the signal processing unit.

Preferably, the scanning mirror comprises two parallel surfaces and the first detection light spot is formed on either one of the surfaces.

Preferably, the first detection light spot is a rectangular light spot. Preferably, the first illumination unit comprises: a light source from which the first measuring beam is emanated; and an illumination lens group configured to collimate the first measuring beam.

Preferably, the first projection unit comprises a projection slit and a projection lens group, wherein the first measuring beam passes through the projection slit and thereby forms the first detection light spot, and wherein the projection lens group is configured to collimate the first detection light spot into a parallel beam.

Preferably, the first detection unit comprises a detection lens, a detection slit, a first relay lens, a second relay lens and a detector, wherein the first reflected beam is converged by the detection lens and the converged beam sequentially passes through the detection slit, the first relay lens and the second relay lens and is then incident on the detector.

Preferably, the detector is a photodetector.

Preferably, the first detection light spot is incident on the scanning mirror after being reflected.

Preferably, the first reflected beam is incident on the first detection unit after being reflected.

The present invention also provides a focusing and leveling system comprising the scanning mirror monitoring system as defined above and a focusing and leveling measuring system, the focusing and leveling measuring system comprising a second illumination unit, a second projection unit, the scanning mirror and a second detection unit, wherein a second measuring beam emanated from the second illumination unit passes through the second projection unit, thereby forming a second detection light spot, and which is further incident on the scanning mirror to form a second reflected light, wherein the second reflected light, after being converged, is incident on a wafer to produce a secondary reflected beam, wherein the secondary reflected beam is collimated into a parallel beam and then is incident on the second detection unit, and wherein both the second detection unit and a wafer stage that supports the wafer are connected to the signal processing unit.

Preferably, the first detection light spot from the scanning mirror monitoring system and the second detection light spot from the focusing and leveling measuring system are incident on a same surface of the scanning mirror.

Preferably, the first detection light spot from the scanning mirror monitoring system and the second detection light spot from the focusing and leveling measuring system are incident on respective surfaces of the scanning mirror.

Preferably, the second illumination unit is implemented as the first illumination unit and the second projection unit as the first projection unit.

Preferably, the focusing and leveling system further comprises a beam splitting prism disposed between the scanning mirror and the first projection unit, the beam splitting prism configured to split the first detection light spot into a first detecting beam and a second detecting beam, the first detecting beam incident on one surface of the scanning mirror, the second detecting beam reflected onto the other surface of the scanning mirror.

The present invention also provides a scanning mirror monitoring method, comprising the steps of:

1) controlling the scanning mirror to vibrate in a simple harmonic motion, monitoring a resulting simple harmonic signal, and recording a periodic optical intensity profile at standard values of a vibration amplitude and a position of the scanning mirror as an original profile;

2) monitoring a change in the optical intensity profile of the simple harmonic motion of the scanning mirror and accordingly recording as a varied optical intensity profile, and if the varied optical intensity profile peaks at a lower value than the original profile, determining that a shift occurs in the position of the scanning mirror, or if the varied optical intensity profile peaks at the same value as the original profile and valleys at a different value from the original profile, determining that a shift occurs in the vibration amplitude of the scanning mirror; and 3) based on the determination in step 2, controlling, by the signal processing unit, the scanning mirror actuator unit to incrementally adjust the scanning mirror until the varied optical intensity profile coincides with the original profile.

Preferably, in step 1 further comprises the periodic optical intensity profile peaks at a phase of 0° or 180° of the scanning mirror and valleys at a phase of 90° or 270° of the scanning mirror.

Preferably, step 2 further comprises: if the varied optical intensity profile peaks at the same value, and valleys at a higher value than, the original profile, determining that the vibration amplitude of the scanning mirror has decreased; or if the varied optical intensity profile peaks at the same value, and valleys at a lower value than, the original profile, determining that the vibration amplitude of the scanning mirror has increased.

Compared to the conventional solutions, in the present invention, the simple harmonic motion detector unit is employed to monitor the simple harmonic motion of the scanning mirror and produces a simple harmonic signal which is received by the signal processing unit used to detect whether there is a variation in the optical intensity profile. If true, the scanning mirror actuator unit adjusts the amplitude and/or position of the scanning mirror. Therefore, the present invention makes it possible to detect in real time variations both in the amplitude and position of the scanning mirror and to accordingly adjust the scanning mirror in real time, without involving the wafer stage system in the photolithography machine or interrupting the normal operation of the machine, resulting in an improvement in the efficiency in monitoring and adjusting the scanning mirror. Moreover, the scanning mirror monitoring method of the present invention is rapid and accurate because it does not involve the wafer under test, i.e., decoupling the wafer from the state changes of the scanning mirror.

BRIEF DESCRIPTION OF THE DRAWINGS

In FIG. 1: 101, a illumination unit; 102, a projection slit; 103, a first planar mirror; 104, a wafer; 105, a second planar mirror; 106, a scanning mirror; 107, a detection slit; and 108, a photodetector.

In FIGS. 2 to 9: 1, a wafer; 2, a projection objective; 3, a second light source; 4, a second illumination lens group; 5, a second projection slit; 6, a second projection lens group; 7, a beam splitting prism; 8, a scanning mirror; 9, a first mirror; 10, a second mirror; 11, a first lens group; 12, a third mirror; 13, a first detection lens; 14, a first detection slit; 15, a first relay lens; 16, a second relay lens; 17, a first detector; 18, a second lens group; 19, a fourth mirror; 20, a second detection lens; 21, a second detection slit; 22, a third relay lens; 23, a fourth relay lens; 24, a second detector; 25, a signal processing unit; 26, a wafer stage; 27, a scanning mirror actuator unit; 28, a first light source; 29, a first illumination lens group; 30, a first projection slit; 31, a first projection lens group; d, a length of the detection light spot; L, a width of the detection light spot.

DETAILED DESCRIPTION

The present invention will be described in detail below with reference to the accompanying drawings.

Embodiment 1

Figure 1:
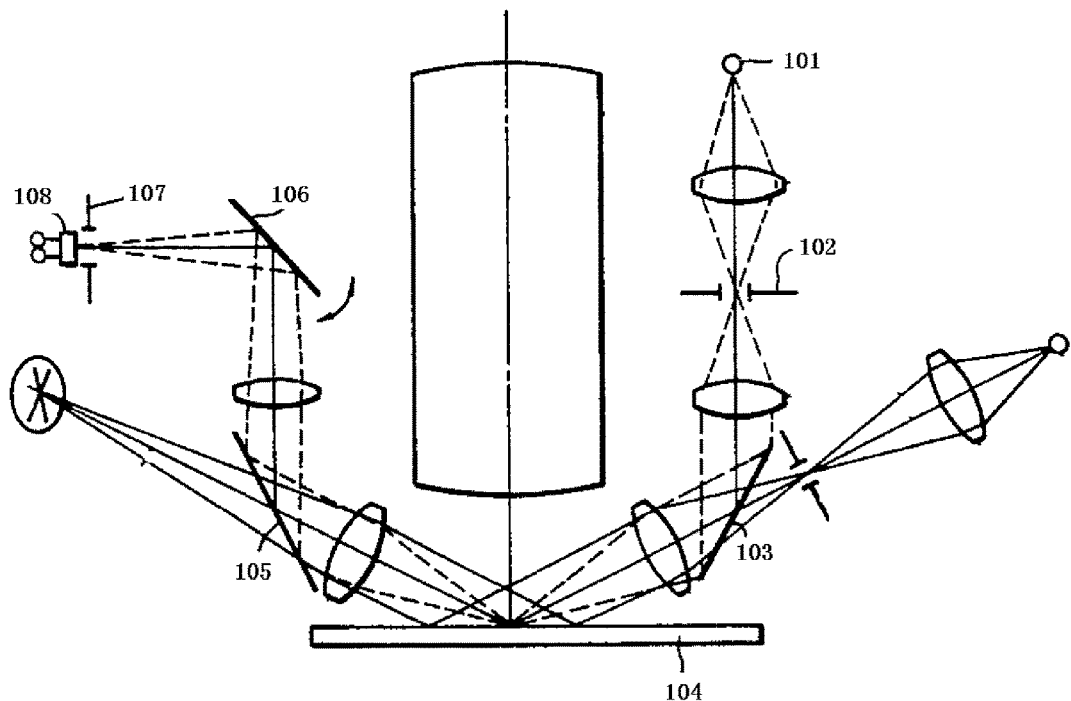
FIG. 1 is a structural schematic of a conventional focusing and leveling system.
Figure 2:
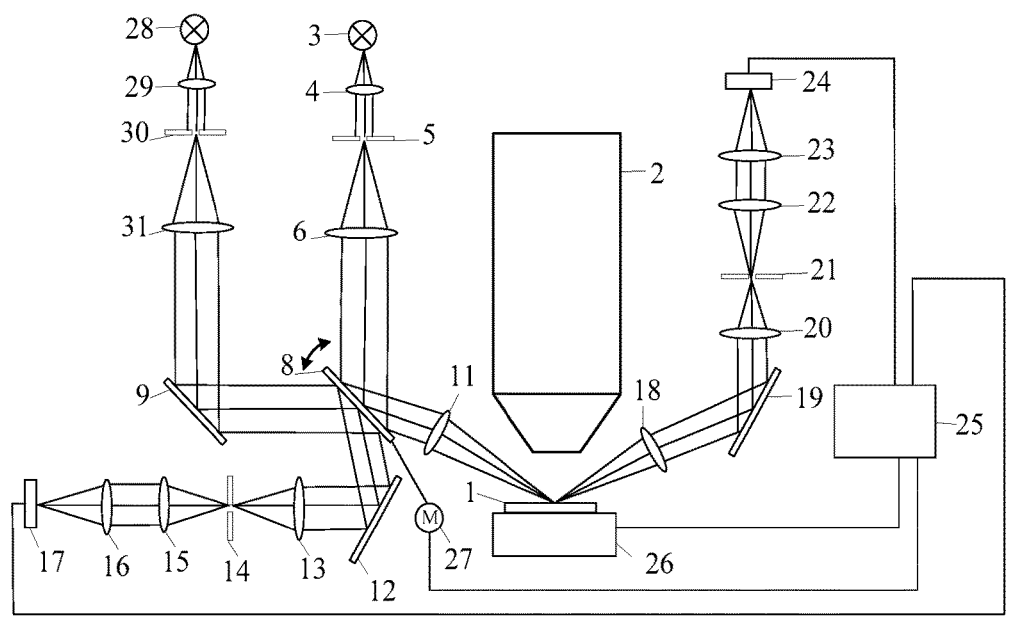
FIG. 2 is a structural schematic of a scanning mirror monitoring system according to a first embodiment of the present invention.

Referring to FIG. 2, the present invention provides a focusing and leveling system comprising a scanning mirror monitoring system as well as a focusing and leveling measuring system. In a photolithography machine, the focusing and leveling system is configured to, during the exposure of a wafer 1, monitor the position of the wafer 1 in an exposure field and to cooperate with a motion control system of a wafer stage 26 to enable precise control. During the exposure, a projection objective 2 projects a pattern on a photomask onto the wafer 1.

Specifically, the scanning mirror monitoring system includes a simple harmonic motion detector unit and a signal processing unit 25. The simple harmonic motion detector unit is configured to monitor a simple harmonic motion of a scanning mirror 8 and to produce a simple harmonic signal. The signal processing unit 25 is configured to receive the simple harmonic signal and, based on a variation in the signal, cause a scanning mirror actuator unit 27 to adjust the vibration amplitude and position of the scanning mirror 8. The simple harmonic signal may be an optical intensity signal.

The simple harmonic motion detector unit may include, disposed sequentially along the propagation of light, a first illumination unit, a first projection unit and a first detection unit.

The first illumination unit may include a first light source 28 and a first illumination lens group 29 which is configured to collimate a measuring beam emanated from the first light source 28.

The first projection unit may include a first projection slit 30 and a first projection lens group 31. The measuring beam passes through the first projection slit 30, thereby forming a detection light spot, and the detection light spot is then collimated by the first projection lens group 31. The detection light spot may be rectangular in shape. The collimated beam is reflected by a first mirror 9 onto one of two parallel surfaces of the scanning mirror 8 and further reflected by the surface (the beam reflected by the surface is referred hereinafter to as the "reflected beam").

The first detection unit may include a first detection lens 13, a first detection slit 14, a first relay lens 15, a second relay lens 16 and a first detector 17. The reflected beam is reflected by a third mirror 12 and converged by the first detection lens 13 to again form the detection light spot. Following that, the light spot successively passes through the first detection slit 14, the first relay lens 15 and the second relay lens 16 and is then incident on the first detector 17. The first detector 17 may be implemented as a photodetector configured to detect the received optical intensity.

The scanning mirror 8 vibrates in a simple harmonic motion so that the first detector 17 produces a simple harmonic optical intensity signal. The first detector 17 is connected to the signal processing unit 25 which receives the simple harmonic signal, monitors based thereon whether a variation has occurred in the amplitude and position of the scanning mirror 8 and causes the scanning mirror actuator unit 27 to adjust the vibration amplitude and position of the scanning mirror 8 if necessary.

The measuring system includes, disposed sequentially along the propagation of light, a second illumination unit, a second projection unit, the scanning mirror and a second detection unit.

The second illumination unit may include a second light source 3 and a second illumination lens group 4 which is configured to collimate a measuring beam emanated from the second light source 3.

The second projection unit may include a second projection slit 5 and a second projection lens group 6. The measuring beam passes through the second projection slit 5, thereby forming a detection light spot, and the detection light spot is then collimated by the second projection lens group 6. The collimated beam is reflected by the other surface of the scanning mirror 8 (the beam reflected by the other surface is referred hereinafter to as the "reflected beam") and the reflected beam is converged by the first lens group 11, thereby again forming the detection light spot. The converged beam from the detection light spot is incident on and reflected by the wafer 1 (the beam reflected by the wafer is referred hereinafter to as the "secondary reflected beam"). The secondary reflected beam is collimated by a second lens group 18 onto a fourth mirror 19.

The second detection unit may include a second detection lens 20, a second detection slit 21, a third relay lens 22, a fourth relay lens 23 and a second detector 24. The secondary reflected beam is reflected by the fourth mirror 19 and converged by the second detection lens 20 so that the detection light spot is still again formed. The converged beam from the detection light spot successively passes through the second detection slit 21, the third relay lens 22 and the fourth relay lens 23 and is then received by the second detector 24. The second detector 24 may be implemented as a photodetector configured to detect the received optical intensity. Both of the second detector 24 and the wafer stage 26 may be connected to the signal processing unit 25.

The scanning mirror 8 vibrates in a simple harmonic motion so that the second detector 24 produces a simple harmonic optical intensity signal. The second detector 24 is connected to the signal processing unit 25 which receives the simple harmonic signal and processes and analyzes it to detect an amount of defocus of the surface of the wafer 1. Based on this amount of defocus, the focusing and leveling system instructs the motion control system of the wafer stage 26 to adjust the position of the wafer 1 in the exposure field.

A detailed description will be given below with reference to FIGS. 3 to 6 about how the scanning mirror monitoring system and the focusing and leveling system work according to the present invention.

Figure 3:
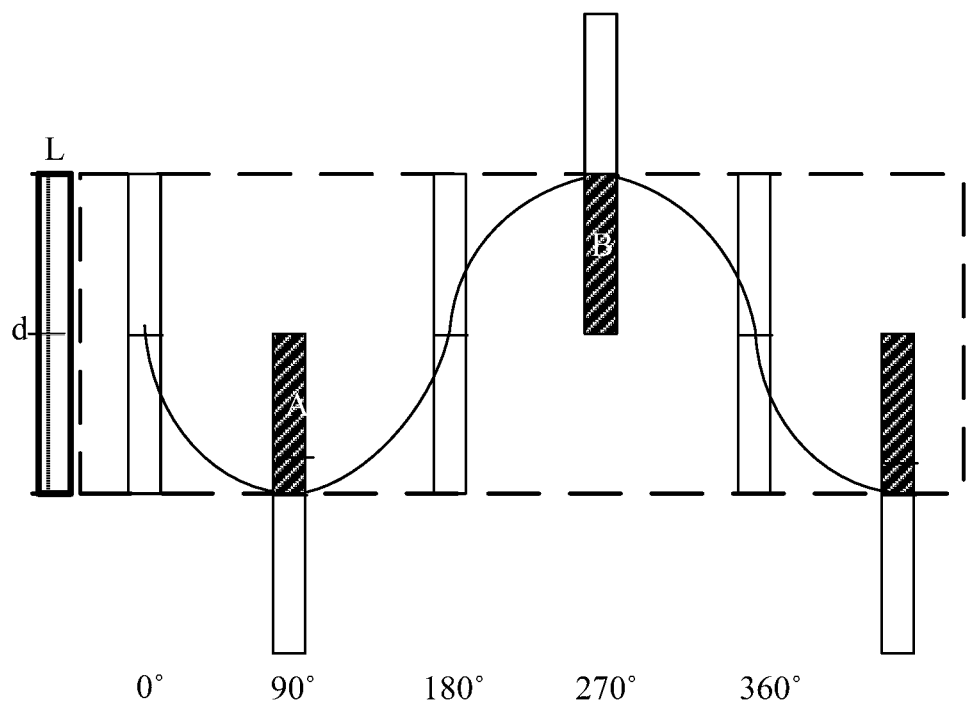
FIG. 3 schematically shows the relationship between a phase angle and a resulting detection light spot in the scanning mirror monitoring system according to the present invention.

After the focusing and leveling system is properly deployed in the photolithography machine, the vibration amplitude and position of the scanning mirror 8 are set to be standard values. The scanning mirror 8 vibrates in a simple harmonic motion, and the scanning mirror monitoring system detects a standard simple harmonic signal and plots an optical intensity profile. As shown in FIG. 3, when the scanning mirror 8 rotates to a phase of 0° or 180°, the detection light spot formed immediately downstream of the first projection slit 30 has a length that is equal to a length of the detection light spot formed immediately downstream of the first detection slit 14, and the optical intensity received by the first detector 17 is at its peak value. When the scanning mirror 8 rotates to a phase of 90° or 270°, the length of the detection light spot formed immediately downstream of the first detection slit 14 is half the length of the detection light spot formed immediately downstream of the first projection slit 30, and the optical intensity received by the first detector 17 is half the peak value. Based on these values, the signal processing unit 25 plots the periodic optical intensity profile (referred hereinafter to as the "original profile"). In FIG. 3, the length of the detection light spot is indicated at d, a width thereof at L and the peak optical intensity value is denoted as $I_{0max}$. In addition, in FIGS. 4 and 5, the optical intensity value detected by the first detector 17 at a phase angle of 90° is indicated at $A_0$ (the detection light spot is illustrated as the shaded black bar A in FIG. 3) and the optical intensity value detected by the first detector 17 at a phase of 270° at $B_0$ (the detection light spot is illustrated as the shaded black bar B in FIG. 3).

Figure 4:
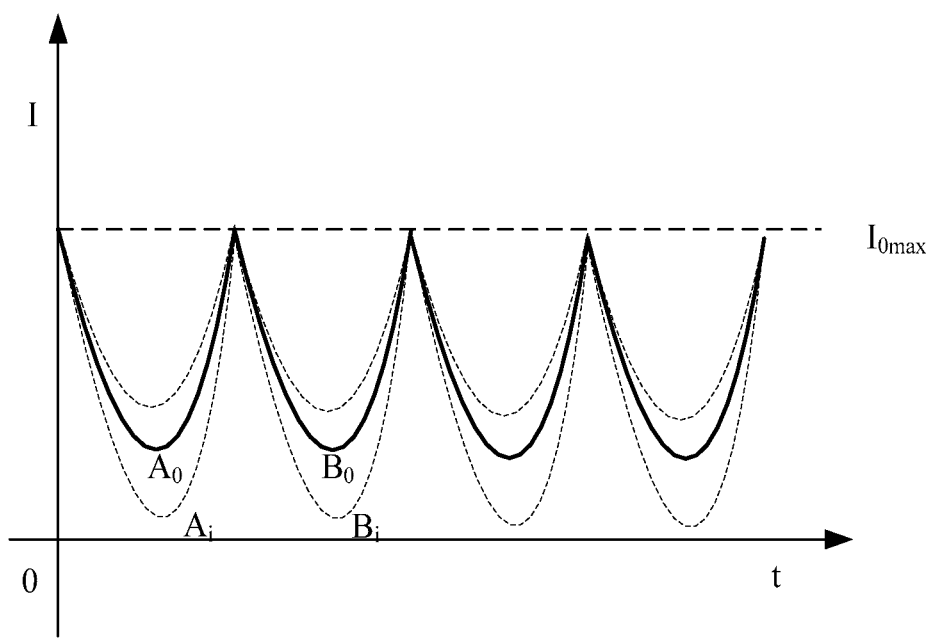
FIG. 4 depicts an optical intensity profile indicating an amplitude shift occurring in the scanning mirror monitoring system according to the present invention.

When the vibration amplitude of the scanning mirror 8 experiences a variation, the optical intensity values of A and B are indicated at $A_i$ and $B_i$, respectively. As shown in FIG. 3, in case that the vibration amplitude increases, the areas of the shaded black bars A and B will both shrink at a phase of 90° or 270°. Accordingly, as shown in FIG. 4, $A_i$ and $B_i$ both decrease, i.e., $A_i<A_0$ and $B_i<B_0$. On the other hand, the peak optical intensity value will not change, i.e., $I_{imax}=I_{0max}$. In this case, the signal processing unit 25 incrementally reduces the vibration amplitude of the scanning mirror 8 until the current optical intensity profile coincides with the original profile, i.e., $A_i=A_0$ and $B_i=B_0$. Similarly, in case that the vibration amplitude decreases, the areas of the shaded black bars A and B will both expand at a phase of 90° or 270° and $A_i$ and $B_i$ accordingly both increase, i.e., $A_i>A_0$ and $B_i>B_0$. On the other hand, the peak optical intensity value will not change, i.e., $I_{imax}=I_{0max}$. In this case, the signal processing unit 25 incrementally augments the vibration amplitude of the scanning mirror 8 until the current optical intensity profile coincides with the original profile, i.e., $A_i=A_0$ and $B_i=B_0$. In this way, the calibration of vibration amplitude is achieved for the scanning mirror 8.

Figure 5:
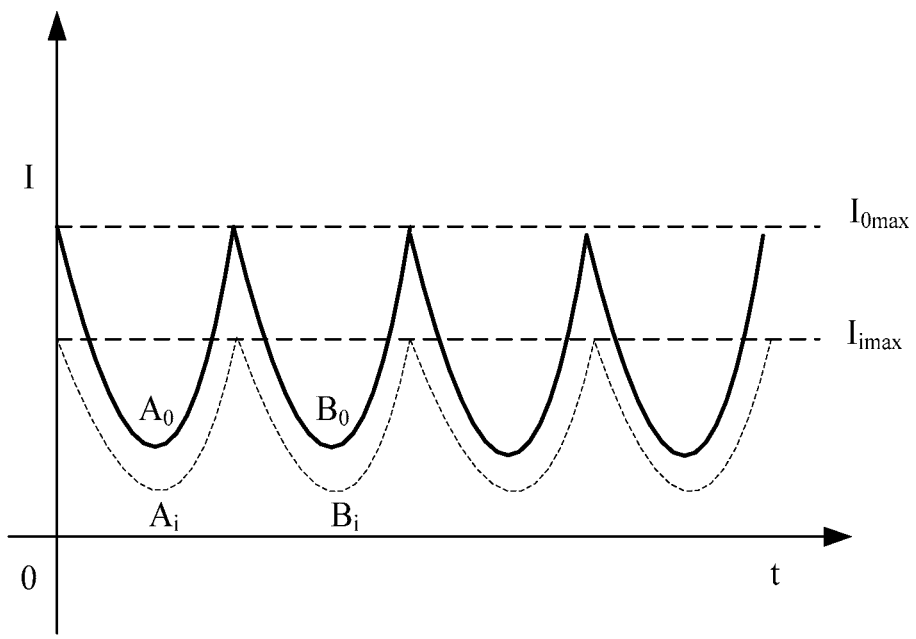
FIG. 5 depicts an optical intensity profile indicating a position shift occurring in the scanning mirror monitoring system according to the present invention.
Figure 6:
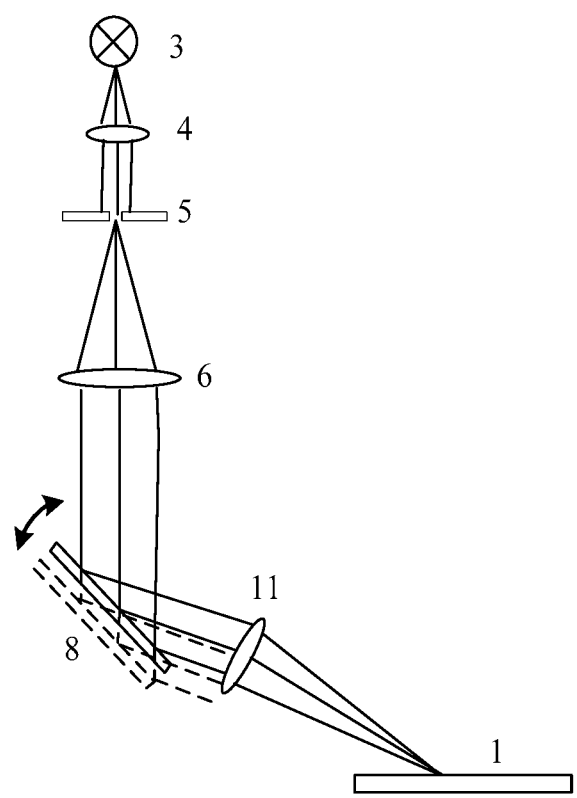
FIG. 6 is a diagram explaining how a position shift takes place in the scanning mirror monitoring system according to the present invention.

As shown in FIG. 6, the measuring beam emanated from the second light source 3 is collimated by the second illumination lens group 4 and passes through the second projection slit 5, thereby forming the detection light spot. The beam from the detection light spot is further collimated by the second projection lens group 6 and irradiated on one of the surfaces of the scanning mirror 8, thereby forming the reflected beam. The reflected beam is converged by the first lens group 11, again forming a detection light spot, and is then irradiated on the wafer 1. When the scanning mirror 8 has shifted in position, for example, from the position indicated by the solid box to that indicated by the dashed box, the reflected beam will be deflected. As a result, part of the beam will not enter the first lens group 11, leading to a decrease in the optical intensity of the detection light spot formed from the convergence. Accordingly, the optical intensity detected by the scanning mirror monitoring system will be lower. In addition, as shown in FIG. 5, during the simple harmonic motion of the scanning mirror 8, regardless of its phase, the optical intensity profile plotted by the signal processing unit 25 will overall shift to lower optical intensity values, i.e., $I_{imax}<I_{0max}$, $A_i<A_0$ and $B_i<B_0$. On such a basis, the signal processing unit 25 incrementally adjusts the position of the scanning mirror 8 until the current optical intensity profile coincides with the original profile. In this manner, the position calibration is achieved for the scanning mirror 8.

Figure 7:
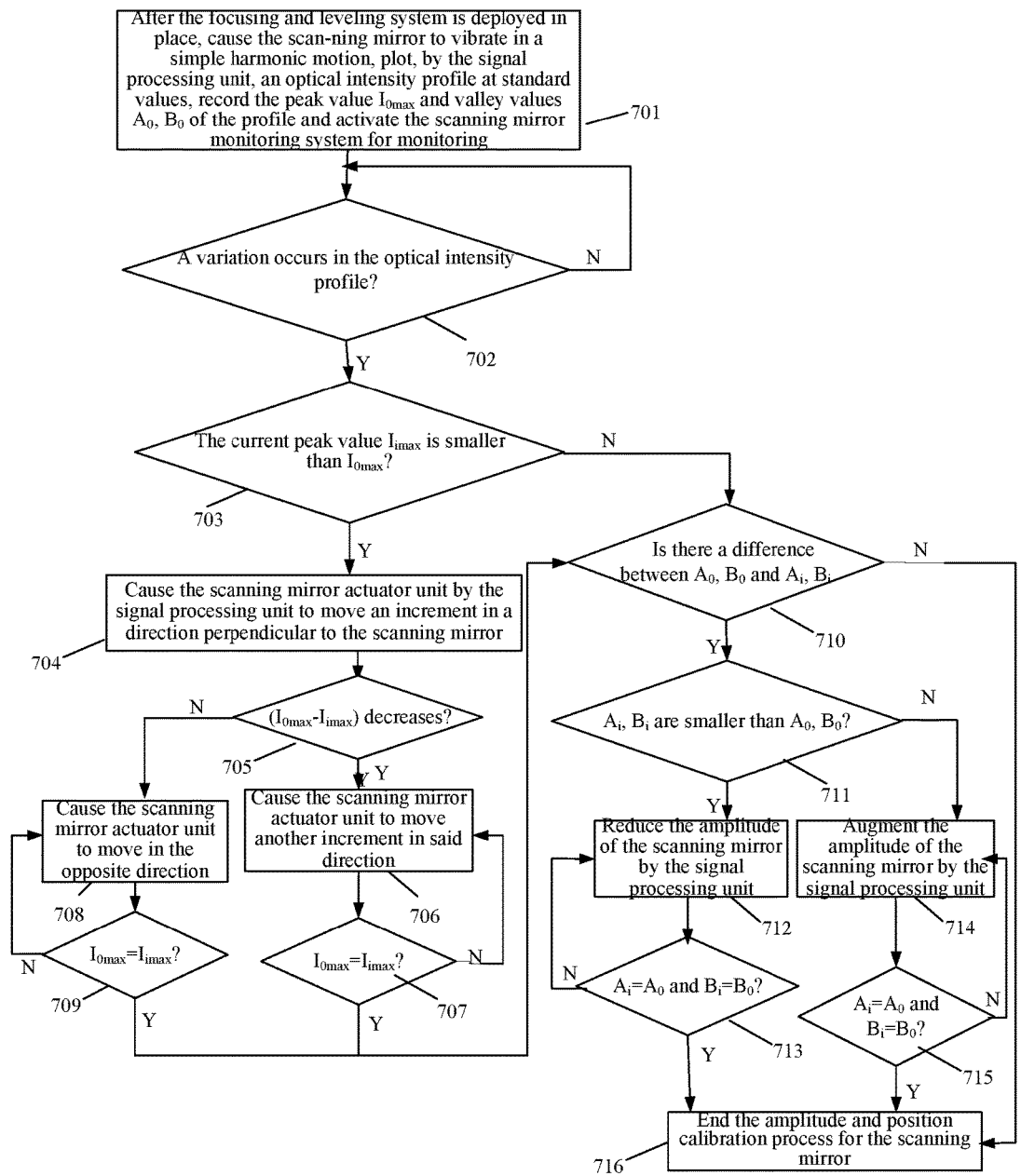
FIG. 7 is a flow chart graphically illustrating a scanning mirror monitoring method according to an embodiment of the present invention.

With reference to FIGS. 7 and 2, a scanning mirror monitoring method includes the following steps.

In step 1, the scanning mirror 8 vibrates in a simple harmonic motion and the resulting simple harmonic signal is monitored. A periodic optical intensity profile is recorded at standard values of vibration amplitude and position as an original profile.

Specifically, a reflected beam formed by a detection light spot incident on the scanning mirror 8 is directed to the first detection unit which produces a simple harmonic signal. The simple harmonic signal is received by the signal processing unit 25 which plots a periodic optical intensity profile based on the signal.

In step 2, if the optical intensity profile experiences a variation, the optical intensity profile with the variation is recorded as a varied optical intensity profile. If the varied optical intensity profile has a lower peak value than the original profile, it is determined that a shift in the position of the scanning mirror 8 occurs. If the varied optical intensity peaks at the same value as the original profile and valleys at different values from the original profile, it is determined that a shift occurs in the vibration amplitude of the scanning mirror 8.

Specifically, if the varied optical intensity peaks at the same value as the original profile and valleys at higher values than the original profile, it is determined that the vibration amplitude of the scanning mirror 8 has decreased. If the varied optical intensity peaks at the same value as the original profile and valleys at lower values than the original profile, it is determined that the vibration amplitude of the scanning mirror 8 has increased.

In step 3, based on the determination, the signal processing unit 25 causes the scanning mirror actuator unit 27 to incrementally adjust the scanning mirror 8 until the varied optical intensity profile coincides with the original profile.

As an example, as shown in FIG. 7, the adjustment process performed by the scanning mirror monitoring system of the present invention for eliminating variations in the vibration amplitude and position of the scanning mirror 8 may include the steps of:

(701) deploying the focusing and leveling system in place, causing the scanning mirror 8 to vibrate in a simple harmonic motion, plotting, by the signal processing unit 25, an optical intensity profile at standard values, recording the peak value $I_{0max}$ and valley values $A_0$, $B_0$ of the profile and activating the scanning mirror monitoring system for monitoring;

(702) determining whether a variation occurs in the optical intensity profile, and if yes, proceeding to step 703, while if no, proceeding to step 702;

(703) determining whether the current peak value $I_{imax}$ is smaller than $I_{0max}$ and if yes, proceeding to step 704, while if no, proceeding to step 710;

(704) causing the scanning mirror actuator unit 27 by the signal processing unit 25 to move an increment in a direction perpendicular to the scanning mirror 8;

(705) determining whether ($I_{0max}-I_{imax}$) decreases and if yes, proceeding to step 706, while if no, proceeding to step 708;

(706) causing the scanning mirror actuator unit 27 to move another increment in said direction;

(707) determining whether $I_{Omax}=I_{imax}$ and if yes, proceeding to step 710, while if no, looping back to step 706;

(708) causing the scanning mirror actuator unit 27 to move in the opposite direction;

(709) determining whether $I_{Omax}=I_{imax}$ and if yes, proceeding to step 710, while if no, looping back to step 708;

(710) determining whether there is a difference between $A_O$, $B_O$ and $A_i$, $B_i$ and if yes, proceeding to step 711, while if no, proceeding to step 716;

(711) determining whether $A_i$, $B_i$ are smaller than $A_O$, $B_O$ and if yes, proceeding to step 712, while if no, proceeding to step 714;

(712) reducing the vibration amplitude of the scanning mirror 8 by the signal processing unit 25;

(713) determining whether $A_i=A_O$ and $B_i=B_O$ and if yes, proceeding to step 716, while if no, looping back to step 712;

(714) augmenting the vibration amplitude of the scanning mirror 8 by the signal processing unit 25;

(715) determining whether $A_i=A_O$ and $B_i=B_O$ and if yes, proceeding to step 716, while if no, looping back to step 714; and (716) ending the amplitude and position calibration process for the scanning mirror.

According to the present invention, the simple harmonic motion detector unit is employed to monitor the simple harmonic motion of the scanning mirror 8 and produces a simple harmonic signal which is received by the signal processing unit 25 and used to detect whether there is a variation in the optical intensity profile. If true, the scanning mirror actuator unit 27 adjusts the amplitude and/or position of the scanning mirror 8 to eliminate the variation. Specifically, if the varied optical intensity profile peaks at a lower value than the original profile, it is determined that a shift occurs in the position of the scanning mirror 8. If the varied optical intensity profile peaks at the same value, and valleys at different values, from the original profile, it is determined that a shift occurs in the vibration amplitude of the scanning mirror 8. Therefore, the present invention makes it possible to measure in real time variations both in the vibration amplitude and position of the scanning mirror 8 and to accordingly adjust the scanning mirror 8 in real time, without involving the wafer stage system in the photolithography machine or interrupting the normal operation of the machine, resulting in an improvement in the efficiency in monitoring and adjusting the scanning mirror 8. Moreover, the scanning mirror monitoring method of the present invention is rapid and accurate because it does not involve the wafer 1 under test, i.e., decoupling the wafer 1 from the status changes of the scanning mirror 8.

Embodiment 2

Figure 8:
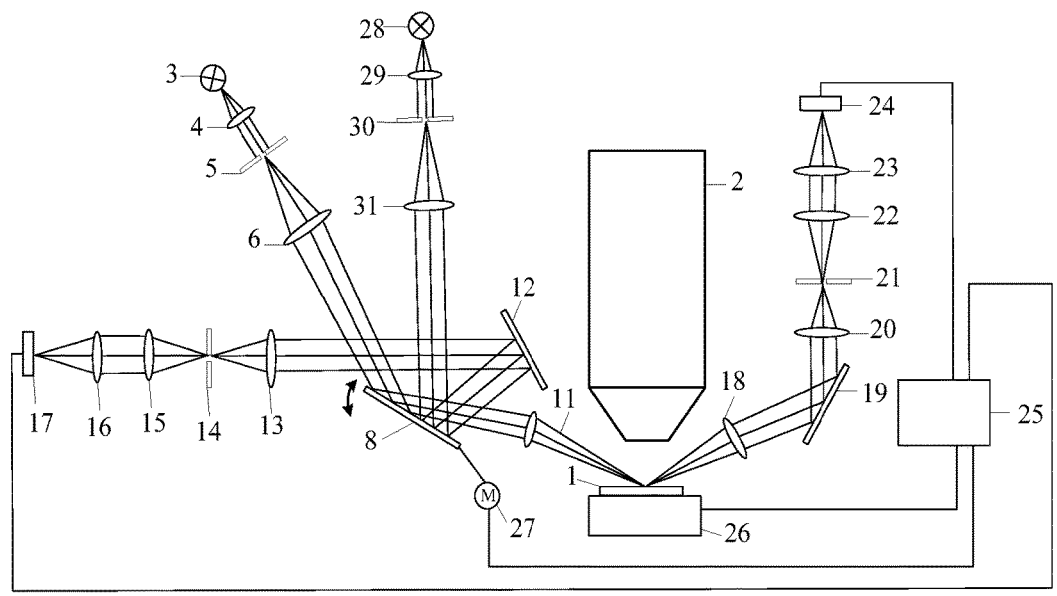
FIG. 8 is a structural schematic of a scanning mirror monitoring system according to a second embodiment of the present invention.
Figure 9:
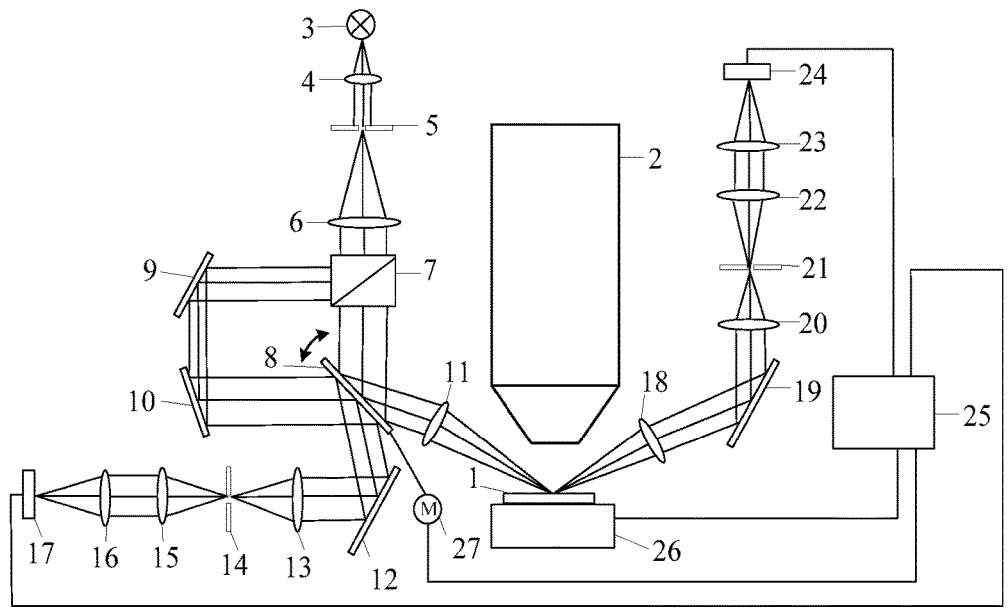
FIG. 9 is a structural schematic of a scanning mirror monitoring system according to a third embodiment of the present invention.

FIG. 8 shows another embodiment of the scanning mirror monitoring system and the focusing and leveling system according to the present invention. This embodiment differs from Embodiment 1 in that the detection light spots of the scanning mirror monitoring system and the measuring system are all formed on the same one of the surfaces of the scanning mirror 8. Accordingly, the second illumination unit and the second projection unit in the measuring system are inclined at certain angles with respect to the first illumination unit and the first projection unit in the scanning mirror monitoring system.

Embodiment 3

FIG. 8 shows a third embodiment of the scanning mirror monitoring system and the focusing and leveling system according to the present invention. This embodiment differs from Embodiments 1 and 2 in that a beam splitting prism 7 is disposed between the scanning mirror 8 and the second projection unit in lieu of the first illumination unit and the first projection unit. The beam splitting prism 7 splits the beam from the detection light spot into a first detecting beam and a second detecting beam. The first detecting beam is directed onto one surface of the scanning mirror 8 in order to accomplish the optical intensity measurement for the measuring system, while the second detecting beam is reflected successively by the first mirror 9 and the second mirror 10 and is incident on the other surface of the scanning mirror 8 in order to accomplish the optical intensity measurement for the scanning mirror monitoring system.

It is noted that Embodiments 1, 2 and 3 are merely some preferred embodiments of the scanning mirror monitoring system and of the focusing and leveling system of the present invention. On the basis of this, more embodiments can be obtained with reasonable modifications without departing from the spirit or scope of the invention. For example, the scanning mirror may have more than two reflecting surfaces and the positional relationships between the reflecting surfaces may be adjustable, as long as when the detection light spots of the scanning mirror monitoring system and the measuring system are formed on different ones of the reflecting surfaces of the scanning mirror, the simple harmonic signals resulting from the simple harmonic motions of these reflecting surfaces are identical to or consistent with each other.

What is claimed is:

1. A scanning mirror monitoring system, comprising a simple harmonic motion detector unit and a signal processing unit, the simple harmonic motion detector unit configured to monitor a simple harmonic motion of a scanning mirror and to produce a simple harmonic signal, the signal processing unit configured to receive the simple harmonic signal and, based on a variation of the simple harmonic signal, control a scanning mirror actuator unit to adjust a vibration amplitude and/or a position of the scanning mirror, wherein the simple harmonic motion detector unit comprises a first illumination unit, a first projection unit and a first detection unit, a first measuring beam emanated from the first illumination unit passing through the first projection unit, thereby forming a first detection light spot, which is further incident on the scanning mirror to produce a first reflected beam, the first reflected beam being incident on the first detection unit, which then produces the simple harmonic signal, the first detection unit connected to the signal processing unit, wherein the first projection unit comprises a projection slit and a projection lens group, the first measuring beam passing through the projection slit and thereby forming the first detection light spot, the projection lens group configured to collimate the first detection light spot into a parallel beam, and wherein the first detection unit comprises a detection lens, a detection slit, a first relay lens, a second relay lens and a detector, the first reflected beam converged by the detection lens, and the converged beam sequentially passing through the detection slit, the first relay lens and the second relay lens and then being incident on the detector.

2. The scanning mirror monitoring system of claim 1, wherein the simple harmonic signal is a simple harmonic optical intensity signal.

3. The scanning mirror monitoring system of claim 1, wherein the scanning mirror comprises two parallel surfaces, and wherein the first detection light spot is formed on either one of the surfaces.

4. The scanning mirror monitoring system of claim 1, wherein the first detection light spot is a rectangular light spot.

5. The scanning mirror monitoring system of claim 1, wherein the first illumination unit comprises: a light source from which the first measuring beam is emanated; and an illumination lens group configured to collimate the first measuring beam.

6. The scanning mirror monitoring system of claim 1, wherein the detector is a photodetector.

7. The scanning mirror monitoring system of claim 1, wherein the first detection light spot is incident on the scanning mirror after being reflected.

8. The scanning mirror monitoring system of claim 1, wherein the first reflected beam is incident on the first detection unit after being reflected.

9. A focusing and leveling system, comprising the scanning mirror monitoring system of claim 1 and a focusing and leveling measuring system, the focusing and leveling measuring system comprising a second illumination unit, a second projection unit, the scanning mirror and a second detection unit, wherein a second measuring beam emanated from the second illumination unit passes through the second projection unit, thereby forming a second detection light spot, which is further incident on the scanning mirror to form a second reflected light, wherein the second reflected light, after being converged, is incident on a wafer to produce a secondary reflected beam, wherein the secondary reflected beam is collimated into a parallel beam and then is incident on the second detection unit, and wherein both the second detection unit and a wafer stage that supports the wafer are connected to the signal processing unit.

10. The focusing and leveling system of claim 9, wherein the first detection light spot from the scanning mirror monitoring system and the second detection light spot from the focusing and leveling measuring system are incident on a same surface of the scanning mirror.

11. The focusing and leveling system of claim 9, wherein the first detection light spot from the scanning mirror monitoring system and the second detection light spot from the focusing and leveling measuring system are incident on respective surfaces of the scanning mirror.

12. The focusing and leveling system of claim 9, wherein the second illumination unit is implemented as the first illumination unit and the second projection unit as the first projection unit.

13. The focusing and leveling system of claim 12, further comprising a beam splitting prism disposed between the scanning mirror and the first projection unit, the beam splitting prism configured to split the first detection light spot into a first detecting beam and a second detecting beam, the first detecting beam incident on one surface of the scanning mirror, the second detecting beam reflected onto the other surface of the scanning mirror.

14. A scanning mirror monitoring method by using the scanning mirror monitoring system of claim 1, comprising the steps of:

1) controlling the scanning mirror to vibrate in a simple harmonic motion, monitoring a resulting simple harmonic signal, and recording a periodic optical intensity profile at standard values of a vibration amplitude and a position of the scanning mirror as an original profile;

2) monitoring a change in the optical intensity profile of the simple harmonic motion of the scanning mirror and accordingly recording a varied optical intensity profile, and if the varied optical intensity profile peaks at a lower value than the original profile, determining that a shift occurs in the position of the scanning mirror, or if the varied optical intensity profile peaks at a same value as the original profile and valleys at a different value from the original profile, determining that a shift occurs in the vibration amplitude of the scanning mirror; and 3) based on the determination in step 2, controlling, by the signal processing unit, the scanning mirror actuator unit to incrementally adjust the scanning mirror until the varied optical intensity profile coincides with the original profile.

15. The scanning mirror monitoring method of claim 14, wherein in step 1 the periodic optical intensity profile peaks at a phase of 0° or 180° of the scanning mirror and valleys at a phase of 90° or 270° of the scanning mirror.

16. The scanning mirror monitoring method of claim 14, wherein step 2 further comprises: if the varied optical intensity profile peaks at the same value, and valleys at a higher value than, the original profile, determining that the vibration amplitude of the scanning mirror has decreased; or if the varied optical intensity profile peaks at the same value, and valleys at a lower value than, the original profile, determining that the vibration amplitude of the scanning mirror has increased.

* * * * *